United States Patent [19]
Bowers

[11] Patent Number: 5,418,491

[45] Date of Patent: May 23, 1995

[54] OPERATIONAL AMPLIFIER COMPENSATION CIRCUIT FOR PREVENTING PHASE REVERSAL AND MAINTAINING PERFORMANCE FOR INPUTS OUTSIDE THE COMMON MODE RANGE

[75] Inventor: Derek F. Bowers, Sunnyvale, Calif.

[73] Assignee: Analog Devices, Inc., Norwood, Mass.

[21] Appl. No.: 272,252

[22] Filed: Jul. 7, 1994

[51] Int. Cl.⁶ .............................................. H03F 3/45
[52] U.S. Cl. .................................... 330/252; 330/261
[58] Field of Search ............... 330/252, 257, 260, 261, 330/292

[56] References Cited

U.S. PATENT DOCUMENTS 5,091,701  2/1992  Butler .................................. 330/252
5,361,040  11/1994  Barrett ............................. 330/257 X

OTHER PUBLICATIONS

Bowers, "A 20-μW Precision Operational Amplifier", *IEEE Journal of Solid-State Circuits*, vol. SC-22, No. 3, Jun. 1987, pp. 322-329.

"Amplifier Reference Manual", *Analog Devices, Inc.*, Norwood, Mass., 1992, pp. 2-761 to 2-764.

*Primary Examiner*—Steven Mottola
*Attorney, Agent, or Firm*—Koppel & Jacobs

[57] ABSTRACT

An operational amplifier input circuit for preventing phase reversal and maintaining performance for inputs outside the common mode range includes a pair of differentially connected transistors for receiving respective differential inputs, and a folded cascode pair of transistors that are coupled to the differential transistors. A pair of resistors are connected between a reference potential and the current circuits of the differential and cascode transistors to produce resistor voltages that control the respective cascode transistors' currents. The differential transistors respond to an input by producing a forward biased parasitic diode in one of the differential transistors. A phase compensation circuit responds to the input by shifting the resistor voltage for the other differential transistor to prevent a phase reversal of the resistor voltages. A current compensation circuit responds to the input by shifting the cascode transistors' base-emitter voltages to decrease their bias currents, and thereby limit their currents to a range within which the operational amplifier does not latch up.

15 Claims, 2 Drawing Sheets

OPERATIONAL AMPLIFIER COMPENSATION CIRCUIT FOR PREVENTING PHASE REVERSAL AND MAINTAINING PERFORMANCE FOR INPUTS OUTSIDE THE COMMON MODE RANGE

BACKGROUND OF THE INVENTION

1. Field of the Invention

The present invention generally relates to the input stage of an operational amplifier, and more specifically to a compensation circuit for maintaining amplifier performance for inputs outside the common mode range.

2. Description of the Related Art

The input stage for an operational amplifier includes a pair of differentially connected transistors that receive differential input signals and provide corresponding differential currents to an active load. The phase of the input signals or currents is a relative term and is defined by the polarity of one signal or current with respect to the other signal or current. An amplifier is in phase when the phases of the input signals and differential currents are the same. Phase reversal of an amplifier occurs when the phase of the differential currents is opposite the phase of the input signals. The amplifier operates over a Common Mode Range (CMR) of input signals that lie between the high and low supply voltages. In the case of a single-sided supply, the CMR includes one of the supply voltages, typically the low supply which is commonly ground reference potential. A particular input stage for a single-sided supply operational amplifier is described in Bowers, "A 20 µW Precision OperationalAmplifier", *IEEE Journal of Solid-State Circuits*, Vol. SC-22, No. 3, June 1987, pp. 322–329.

If one of the input signals is driven outside of the CMR due to noise or improper drive circuitry, the corresponding differential transistor will either turn off or form a forward biased parasitic diode. When the junction forward biases, the phase of the differential currents reverses with respect to the phase of the input signals and may cause the amplifier to malfunction and latch up (stop working). In Analog Devices products OP-113, OP-213 and OP-413 a pair of phase compensation diodes are cross-coupled between the differential inputs and the other differential transistors' collectors to prevent phase reversal of the amplifier. When either one of the differential transistors' collector-base junctions is forward biased, the corresponding cross-coupled diode conducts and prevents a phase reversal of the differential currents. This prevention of phase reversal is at the cost of greatly increasing the magnitudes of the differential currents, on the order of twenty to thirty times the normal current values. Although amplifier failure is less likely to occur, these extremely high current levels can still cause the active load to malfunction and latch up the amplifier.

SUMMARY OF THE INVENTION

The present invention seeks to provide an operational amplifier input circuit that prevents phase reversal and maintains amplifier performance for inputs outside the common mode range.

This is accomplished with an operational amplifier input circuit that includes a pair of differentially connected transistors for receiving respective differential inputs, and a folded cascode pair of transistors that are coupled to the differential transistors. A pair of resistors are connected between a reference potential and the current circuits of the differential and cascode transistors to produce resistor voltages that control the respective cascode transistors' currents. The differential transistors respond to an input by producing a forward bias parasitic diode in one of the differential transistors. A phase compensation circuit responds to the input by shifting the resistor voltage for the other differential transistor to prevent a phase reversal of the resistor voltages. A current compensation circuit responds to the input by shifting the cascode transistors' base-emitter voltages to decrease their bias currents, and thereby limit their currents to a range within which the operational amplifier does not latch up.

These and other features and advantages of the invention will be apparent to those skilled in the art from the following detailed description, taken together with the accompanying drawings.

DETAILED DESCRIPTION OF THE INVENTION

Figure 1:
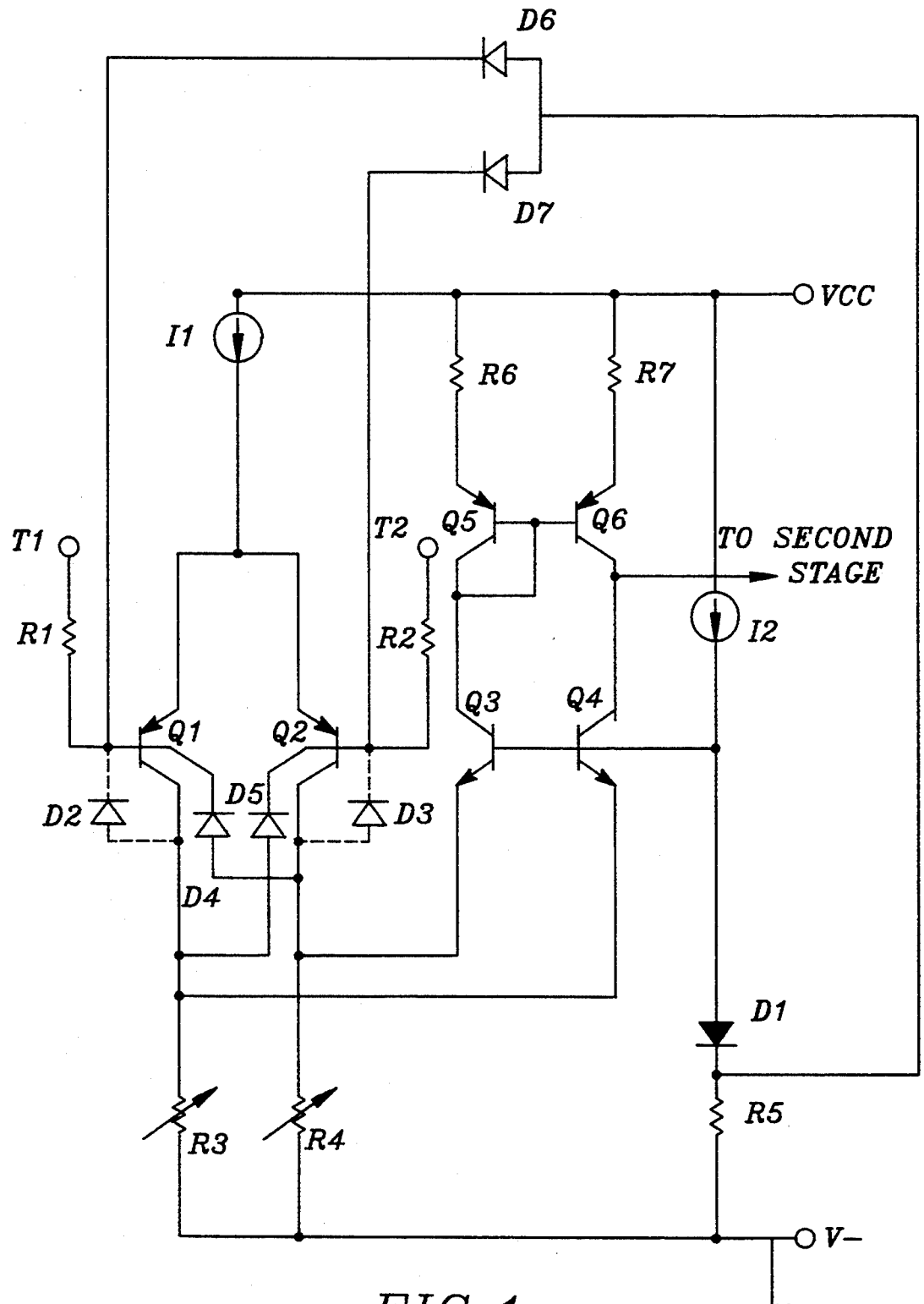
FIG. 1 is a schematic diagram of an operational amplifier input stage that incorporates the present invention.

A preferred circuit configuration that embodies the principles of the invention is illustrated in FIG. 1. While a specific circuit is shown, it could be modified in various ways without departing from the invention. For example, the bipolar transistor types could be reversed (npn vs. pnp), with a corresponding adjustment in the voltage supplies. Accordingly, the circuit shown is for illustration only, and is not intended to limit the invention to any particular circuitry.

FIG. 1 is a schematic diagram of a single-sided supply input stage that includes cross-coupled phase compensation diodes for preventing phase reversal, and current compensation diodes for preventing overshoot of the differential currents. A pair of differentially connected transistors Q1 and Q2, which can be either bipolar or junction field effect transistors (JFETs), have their current circuits connected together on one side to divide the output of a current source I1. As used herein, a transistor's "current circuit" refers to the collector-emitter circuit of a bipolar transistor, or the source-drain circuit of a JFET; a transistor's "control circuit" refers to the base of a bipolar device, or the gate of an JFET. In the preferred embodiment, the differential transistors are bipolar pnp transistors.

The input terminals T1 and T2 are adapted to receive differential input signals through series resistors R1 and R2. In the manner characteristic of differential amplifiers, Q1 and Q2 divide the current from I1 in mutual opposition, with the amount of current through each transistor varying according to the relative input voltage signals applied to their bases from the input terminals. If a constant, known bias is applied to one of the input transistor bases, the magnitude of the signal at the base of the other input transistor can be determined by the amount of current flowing through that transistor.

The input current source I1 operates from a positive voltage supply bus Vcc, while the collectors of pnp input transistors Q1 and Q2 are connected to a relatively negative voltage supply bus V− (preferably ground potential) through respective series-connected first and second trimmable input resistors R3 and R4. The trimmable resistors can be used to minimize the circuit's offset voltage (Vos).

The input stage includes a folded cascode pair of active load npn bipolar transistors Q3 and Q4, whose emitters are connected to the collectors of input transistors Q2 and Q1, respectively. The bases of Q3 and Q4 are connected together for common biasing. A bias circuit for these transistors consists of a current source I2 that is connected to the transistors' bases and to a diode D1, which is connected through resistor R5 to ground potential. Diode D1 can be a diode-connected transistor. The magnitudes and relative phase of the currents flowing through Q3 and Q4's current circuits are controlled by the base-emitter voltages, which are determined by the bias voltages at their bases and by the voltages across R3 and R4. The base-emitter voltages control the bias current for the transistors.

The active load is formed by a pair of pnp transistors Q5 and Q6, whose emitters are connected to Vcc through resistors R6 and R7 and whose bases are connected together for common biasing. Transistor Q5's base and collector are connected to transistor Q3's collector, and transistor Q6's collector is connected to transistor Q4's collector. The output current to the second stage of the amplifier is taken at the collector of transistor Q6. Q5 and Q6 are connected as a current mirror, with the current through Q6 mirroring that through Q5. Any imbalance in the input signals at T1 and T2 causes an imbalance in the currents through Q3 and Q4. The output current to the second stage reconciles the equal current through Q5 and Q6 with any current imbalance between Q3 and Q4.

As the input signal at T1 or T2 is decreased relative to the other input signal, its collector current increases, which causes the respective resistor voltage to increase. However, if one of the input voltages at T1 or T2 falls more than a diode drop below the voltage across respective resistor R3 or R4, the collector-base pn junction of its respective input transistor Q1 or Q2 becomes forward biased. This creates a parasitic diode D2 or D3 that reverses the current flow through the collector-base junction, which decreases the voltage across resistor R3 or R4 and reverses the phase of the cascode transistors Q3 and Q4's currents such that the amplifier is phase reversed. As one of the differential inputs is decreased, the respective resistor voltage should increase, but the existence of the forward biased parasitic diode causes the resistor voltage to decrease instead and results in phase reversal of the amplifier. For bipolar differential transistors, the input stage is typically biased so that phase reversal occurs at input signals outside the CMR and below the low reference potential. For example, if the resistor voltages are biased to 80 mV, the junction will forward bias for an input of approximately −400 mV at room temperature. However, if the resistor voltages increase, it is possible that phase reversal can occur for input signals inside the CMR.

A pair of phase compensation diodes D4 and D5 are cross-coupled between the bases and collectors of Q1 and Q2 to prevent phase reversal of the currents flowing through Q3 and Q4. When one input is driven more than a diode drop below the corresponding resistor R3 or R4 voltage, the cross-coupled diode D4 or D5 connected to that input conducts and reduces the voltage across the other resistor R4 or R3 to a smaller value to prevent phase reversal of the resistor voltages, and thus phase reversal of Q3 and Q4's currents. For the same voltage, the phase compensation diodes conduct more current than the differential transistors' parasitic diodes to prevent phase reversal. In normal operation, the phase compensation diodes are reverse biased and have no effect on the input circuit.

The circuit as described to this point is conventional. While the operational amplifier avoids phase reversal problems, the effect of forward biasing one of the parasitic diodes and activating one of the cross-coupled diodes is to reduce the voltages across R3 and R4 in response to the differential transistor's forward biased collector-base junction and the cross-coupled diode. Thus, the base-emitter voltages across the cascode transistors Q3 and Q4, and hence their bias currents increase so that their currents increase exponentially, on the order of twenty to thirty times their normal levels. These much higher current levels can cause the active load to malfunction and latch up the amplifier.

In accordance with the invention, a pair of current compensation diodes D6 and D7 are connected between the bases of Q1 and Q2, and the connection of D1 and R5. When either Q1 or Q2's collector-base junction is forward biased, the respective diode D6 or D7 conducts and draws current through D1 and R5 to reduce the bias voltage at the base of cascode transistors Q3 and Q4, which reduces their respective bias currents and hence their collector-emitter currents. The drop in bias voltage substantially offsets the voltage drops across resistors R3 and R4 due to the parasitic diode and phase compensation diode, and maintains the magnitudes of Q3 and Q4's collector-emitter currents within approximately two to three times their normal values. The size of D6 and D7 depends on the specific input stage design and the particular differential input condition that causes phase reversal. If the compensation diodes are too small, they won't stop the collector-emitter currents through Q3 and Q4 from overshooting. If they're too big they will turn on before the CMR is exceeded, and may turn the cascode transistors off when they should be conducting. For the circuit using pnp differential transistors, the compensation diodes are approximately 1.5 times bigger than the parasitic diodes and conduct approximately 1.5 times the current. Preferably the current compensation diodes D6 and D7 are selected to be the same size as the phase compensation diodes D4 and D5. In normal operation, with inputs in the CMR and proper biasing, the current compensation diodes are reverse biased and have no effect on the input circuit.

Exceeding the amplifier's common mode range and forward biasing one of the differential transistors' collector-base junctions, tends to diminish the amplifier's performance. The parasitic diode and compensation diodes distort the cascode transistors' collector-emitter currents such that the output current to the second stage will not correctly reflect the differential inputs. However, by preventing phase reversal and limiting the magnitudes of the differential currents, the amplifier maintains adequate performance for inputs outside the CMR, does not malfunction and latch up, and functions properly when the inputs return to the CMR.

Figure 2:
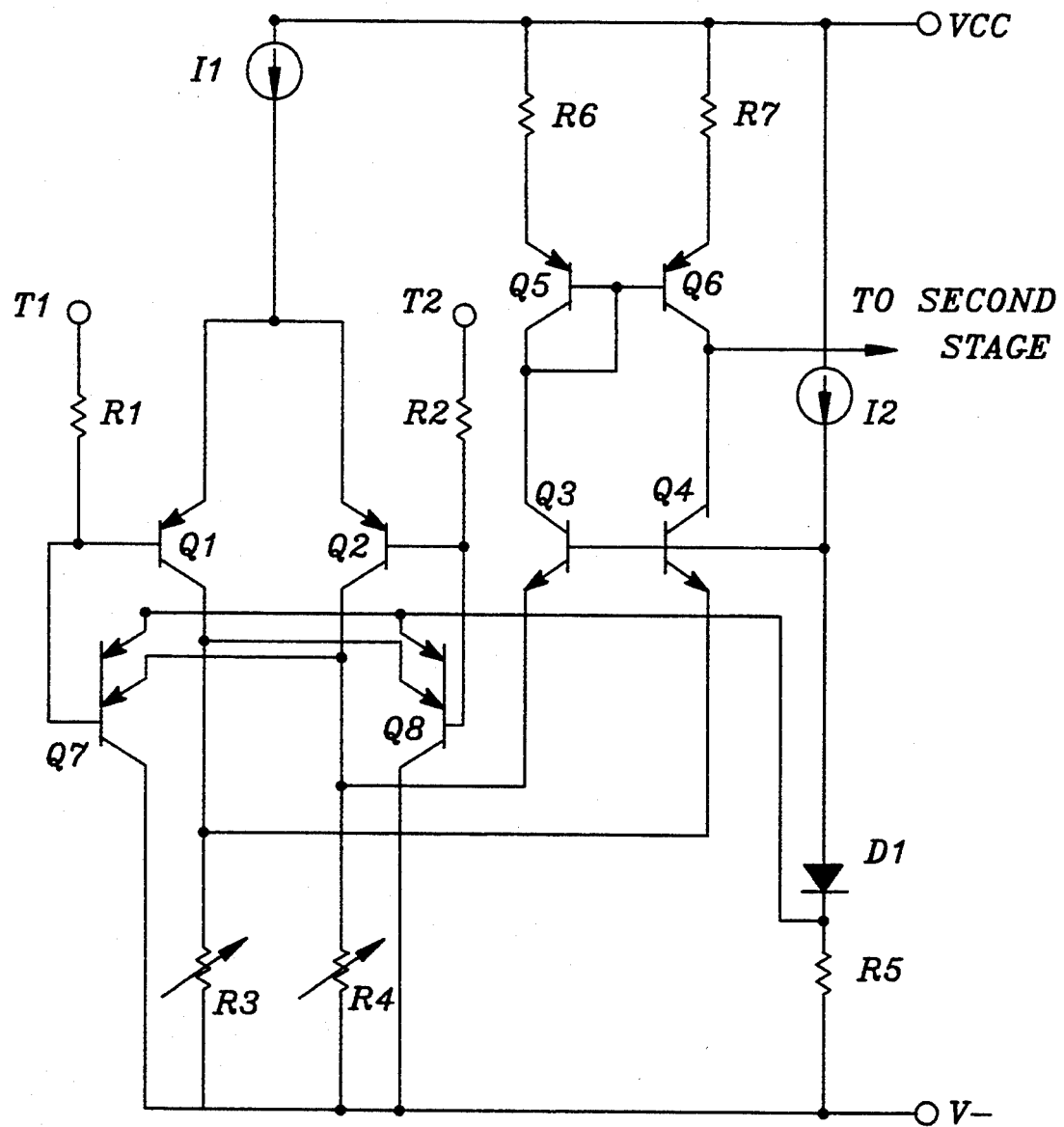
FIG. 2 is a schematic diagram of an alternative embodiment of the invention.

FIG. 2 is a schematic of an alternative embodiment for the phase compensation and current compensation diodes. The phase and current compensation diodes for each differential transistor are implemented with twin-emitter pnp transistors Q7 and Q8. The twin-emitter transistors form forward biased diodes when the input is driven more than a diode drop below the corresponding resistor R3 or R4 voltage. The twin-emitter transistors' bases are connected to the respective differential transistors' bases and their collectors are connected to ground potential. One of Q7's emitters is connected to differential transistor Q2's collector, and one of Q8's emitters is connected to differential transistor Q1's collector. The transistors' other emitters are connected to the junction of diode D1 and resistor R5. The active area of the twin-emitter transistors is substantially larger than the differential transistors' active area, and thus they conduct more current than the differential transistors' parasitic diodes when forward biased. This prevents phase reversal of the resistor voltages across R3 and R4. Furthermore, the twin-emitter pnp transistors provide equal amounts of current for phase compensation and cascode transistor bias compensation such that the two substantially offset and provide differential currents within two to three times their normal values. In normal operation, the twin-emitter transistors are turned off.

In another embodiment, the bipolar differential transistors are replaced by JFETs. When the differential input is more than a diode drop below the resistor voltage, the JFET's gate-drain junction becomes forward biased and creates a parasitic diode. In JFET circuits, the resistor voltages are higher than in the bipolar circuits to achieve adequate gain. The result is that JFET circuits can experience phase reversal conditions for input voltages well inside the CMR.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. An input circuit for an operational amplifier, comprising:
   a pair of differentially connected transistors that have respective current and control circuits and are connected to receive respective differential inputs, said differential transistors responding to a particular input by producing a forward-biased parasitic diode in one of said differential transistors;
   a folded cascode pair of transistors that have respective current and control circuits, and are coupled to said differential transistors;
   a pair of resistors connected between a reference potential and the current circuits of the differential and cascode transistors to produce resistor voltages that control the currents flowing through said cascode transistors' current circuits;
   a phase compensation circuit that responds to the particular input by shifting the resistor voltage for the other differential transistor to prevent a phase reversal of the resistor voltages; and
   a current compensation circuit that responds to the particular input by shifting the cascode transistors' base-emitter voltages to limit the magnitudes of said cascode transistors' circuit currents to a range within which the operational amplifier does not latch up.

2. The operational amplifier of claim 1, further comprising:
   a bias circuit connected between said cascode transistors' control circuit and said reference potential to provide a cascode transistor bias voltage, said current compensation circuit being coupled between the differential transistors' control circuits and said bias circuit to shift said bias voltage.

3. The operational amplifier of claim 2, wherein said current compensation circuit comprises a pair of diodes, with at least one of the current compensation diodes conducting in response to the particular input to shift said bias voltage.

4. The operational amplifier of claim 3, wherein said current compensation diodes are pnp transistors with respective emitters, bases and collectors, with at least one of the pnp transistors' collector-base junctions forming a forward biased diode in response to the particular input.

5. The operational amplifier of claim 1, wherein said differential transistors are pnp transistors that have respective emitters, bases and collectors, said cascode transistors are npn transistors that have respective emitters, bases and collectors, said reference potential is a low reference potential, said phase compensation circuit comprises a pair of diodes that are cross-coupled between the differential transistors' bases and the resistor connected to the other differential transistor and said current compensation circuit comprises a pair of diodes that are coupled between the differential transistors' bases and the cascode transistors' bases, with at least one phase compensation diode and at least one current compensation diode conducting in response to the particular input.

6. The operational amplifier of claim 5, wherein said phase compensation diodes comprise the base-collector junctions of a pair of pnp transistors that have respective emitters, bases and collectors, and said current compensation diodes comprise the base-collector junctions of a second pair of pnp transistors that have respective emitters, bases and collectors.

7. The operational amplifier of claim 6, wherein said first and second pairs of pnp transistors comprise first and second twin-emitter pnp transistors, with each twin-emitter transistor having one emitter coupled to its respective cascode transistor's base and its other emitter coupled to its respective resistor.

8. The operational amplifier of claim 5, wherein said particular input occurs when either differential input is more than a diode voltage below its respective resistor voltage.

9. An operational amplifier, comprising:
   an input stage that includes a pair of transistors that have respective control and current circuits and are differentially connected to receive respective differential inputs, said differential transistors responding to a particular input by producing a forward-biased parasitic diode in one of said differential transistors, and a cascode pair of transistors that have respective control and current circuits and are coupled to said differential transistors;
   a phase compensation circuit that responds to the particular input by increasing the current flowing through the current circuit of the cascode transistor that is coupled to the other differential transistor to prevent a phase reversal of the output transistors' currents; and
   a current compensation circuit that responds to the particular input by decreasing the currents flowing through said cascode transistors' current circuits to limit their magnitudes to a range within which the operational amplifier does not latch up.

10. The operational amplifier of claim 9, further comprising:
   a bias circuit coupled to said cascode transistors' control circuits to provide bias currents, said current compensation circuit being coupled between the differential transistors' control circuits and said bias circuit to reduce said bias currents.

11. The operational amplifier of claim 10, wherein said current compensation circuit comprises a pair of diodes, with at least one current compensation diode conducting in response to the particular input to reduce said bias currents.

12. The operational amplifier of claim 11, wherein said diodes are pnp transistors with respective emitters, bases and collectors, with at least one of the base-collector junctions forming a forward biased diode in response to the particular input.

13. The operational amplifier of claim 11, wherein said particular input occurs when either differential input is more than a diode voltage below its respective resistor voltage.

14. A method for compensating an operational amplifiers input stage's differential load currents, the input stage including a pair of transistors differentially connected to receive respective differential inputs, said differential transistors responding to a particular input by producing a forward-biased parasitic diode in one of said differential transistors, and a cascode pair of transistors that are coupled to said differential transistors and provide differential load currents, and a phase compensation circuit that responds to the particular input by increasing the load current from the cascode transistor that is coupled to the other differential transistor to prevent a phase reversal of the load currents, the method comprising:
   sensing the particular input; and
   reducing said load currents to limit their magnitudes to a range within which the operational amplifier does not latch up.

15. The method of claim 14, wherein the step of reducing said load currents, comprises:
   reducing a bias current to said cascode transistors.

* * * * *